US008541888B2

(12) United States Patent    (10) Patent No.:     US 8,541,888 B2
Choi et al.                  (45) Date of Patent:     Sep. 24, 2013

(54) PAD LAYOUT STRUCTURE OF A DRIVER IC CHIP

(75) Inventors: Joung Cheul Choi, Daejeon-si (KR); An Young Kim, Daejeon-si (KR); Joon Ho Na, Daejeon-si (KR); Dae Seong Kim, Daejeon-si (KR); Dae Keun Han, Daejeon-si (KR)

(73) Assignee: Silicon Works Co., Ltd., Daejeon-Si (KR)

( * ) Notice: Subject to any disclaimer, the term of this patent is extended or adjusted under 35 U.S.C. 154(b) by 0 days.

(21) Appl. No.: 12/997,206

(22) PCT Filed: May 22, 2009

(86) PCT No.: PCT/KR2009/002692
§ 371 (c)(1),
(2), (4) Date: Dec. 9, 2010

(87) PCT Pub. No.: WO2009/154354
PCT Pub. Date: Dec. 23, 2009

(65) Prior Publication Data
US 2011/0089576 A1    Apr. 21, 2011

(30) Foreign Application Priority Data

Jun. 16, 2008 (KR) .................. 10-2008-0056179

(51) Int. Cl.
*H01L 23/52*      (2006.01)
(52) U.S. Cl.
USPC ................... 257/777; 257/E23.141; 345/206; 349/149; 349/150; 349/151; 349/152

(58) Field of Classification Search
USPC ......... 345/100, 206; 349/149–452; 257/777, 257/E23.141, 785; 361/760
See application file for complete search history.

(56) References Cited

U.S. PATENT DOCUMENTS

| 6,160,307 A * | 12/2000 | Kweon .......................... 257/676 |
| 7,567,231 B2 * | 7/2009 | Takahashi et al. ............ 345/100 |
| 7,732,933 B2 * | 6/2010 | Chung et al. .................. 257/779 |
| 2005/0205877 A1 | 9/2005 | Takahashi et al. |
| 2007/0138654 A1 * | 6/2007 | Kim .............................. 257/786 |

FOREIGN PATENT DOCUMENTS

| CN | 2731710 | 10/2005 |
| JP | 6-222378 | 8/1994 |
| JP | 11-95241 | 4/1999 |
| JP | 11-095241 A | 4/1999 |

(Continued)

OTHER PUBLICATIONS

International Search Report, Application No. PCT/KR2009/002692, dated Dec. 14, 2009.

(Continued)

*Primary Examiner* — Matthew Landau
*Assistant Examiner* — Edward Chin
(74) *Attorney, Agent, or Firm* — Kile Park Reed & Houtteman PLLC

(57) ABSTRACT

A pad layout structure of a driver IC chip to be mounted to a liquid crystal display panel. The pad layout structure includes power pad sections placed at respective four corners of the driver IC chip and each having a first power pad for supplying first power to the driver IC chip, a second power pad for supplying second power to the driver IC chip, a third power pad for supplying third power to the driver IC chip and a fourth power pad for supplying fourth power to the driver IC chip.

19 Claims, 3 Drawing Sheets

(56) References Cited

FOREIGN PATENT DOCUMENTS

| JP | 11-295756 A | 10/1999 |
| JP | 2004-361722 | 12/2004 |
| JP | 2007-227579 | 9/2007 |
| KR | 10-2006-0034034 A | 4/2006 |
| KR | 10-2008-0000369 A | 1/2008 |
| TW | 200428321 | 12/2004 |

OTHER PUBLICATIONS

Written Opinion of the International Searching Authority, Application No. PCT/KR2009/002692, dated Dec. 14, 2009.

* cited by examiner

PAD LAYOUT STRUCTURE OF A DRIVER IC CHIP

BACKGROUND OF THE INVENTION

1. Field of the Invention

The present invention relates to a pad layout structure of a driver IC (integrated circuit) chip in a liquid crystal display, and more particularly, to a pad layout structure of a driver IC chip in which, when mounting a driver IC chip to a liquid crystal display panel in a chip-on-glass (COG) type, power pads of the driver IC chip are located at the corners of the driver IC chip in all four directions so that the adhesion between the driver IC chip and the liquid crystal display panel can be enhanced.

2. Description of the Related Art

A liquid crystal display (LCD) indicates a device in which image data is displayed by passing light rays through liquid crystal based on the fact that the alignment of liquid crystal molecules is changed depending upon an applied voltage. Among LCDs, a thin film transistor (TFT) LCD, which is manufactured using technology for manufacturing a silicon integrated circuit, is most widely used these days.

FIG. 1 is a view schematically illustrating the structure of a conventional liquid crystal display.

A TFT LCD comprises a liquid crystal display panel 30 in which a thin film transistor array substrate and a color filter substrate facing each other are bonded to each other with a predetermined space defined therebetween and liquid crystal is injected into the predetermined space, and a driving circuit for driving the liquid crystal display panel 30.

The driving circuit includes a gate driver integrated circuit 40 which sequentially applies scanning signals to gate lines every frame, a source driver integrated circuit 20 which drives source lines in response to the scanning signals from the gate driver integrated circuit 40, a timing control section 10 which controls the gate driver integrated circuit 40 and the source drive integrated circuit 20 and outputs pixel data, and a power supply section (not shown) which supplies various driving voltages to be used in the LCD.

In general, a method for connecting the driver integrated circuit with the liquid crystal display panel is divided into a tape automated bonding (TAB) type in which the driver integrated circuit is mounted on a thin contractible film made of a polymeric material, that is, a tape carrier package (TCP), and the thin contractible film is connected with the liquid crystal display panel so as to electrically connect the driver integrated circuit with the liquid crystal display panel, and a chip-on-glass (COG) type in which the driver integrated circuit is directly mounted to the glass substrate of the liquid crystal display panel using bumps.

Although the TAB type has been widely used in the past in that adhesion is excellent and TAB can be easily modified, the COG type is recently gaining popularity in that COG is advantageous for miniaturization and the manufacturing cost is low.

COG means a method in which the output electrodes of the driver integrated circuit are directly connected to pads so that the substrate and the driver integrated circuit are integrated with each other. In the COG type, when conducting a process for bonding the bumps and the pads, the bumps and the pads are bonded to each other by the medium of conductive particles which are placed therebetween.

In the COG type, the signal lines of the chips of the driver integrated circuits, which are mounted to the liquid crystal display panel, are connected with each other in a line-on-glass (LOG) type in which the signal lines are directly mounted to the thin film transistor array substrate. The chips of the driver integrated circuits are supplied with control signals and driving voltages from the timing control section and the power supply section.

FIG. 2 is a view illustrating a pad layout structure of a driver IC chip which is mounted in a COG type according to the conventional art.

Referring to FIG. 2, it is the norm that a driver IC (integrated circuit) chip has a rectangular shape in which the length thereof in the transverse direction is greater than the length thereof in the longitudinal direction due to the application characteristic of the LCD.

In a driver IC chip 200 which is mounted in a COG type according to the conventional art, an internal circuit 210 is centrally placed, an input pad section 220 is placed adjacent to the upper side edge of the chip 200, and an output pad section 230 is placed adjacent to the lower side edge of the chip 200. Besides, in the driver IC chip 200, there should be placed power supply lines 251 and 252 and power pads 241a through 241d and 242a through 242d.

In the case where not only the internal circuit, the input pad section and the output pad section but also the power supply lines and the power pads are all designed in the driver IC chip, the size of the panel, to which the driver IC chip is to be mounted, should be increased, and accordingly, a required amount of glass is also increased.

Therefore, in the conventional art, when designing a source driver IC chip and a gate driver IC chip, in order to decrease the area occupied by the power lines and the ground lines of the driver IC chip, power pads and ground pads are placed adjacent to the input pad section of the driver IC chip or at the left or right end portion A of the driver IC chip.

When the power pads and the ground pads are placed adjacent to the input pad section of the driver IC chip or at the left or right end portion A of the driver IC chip, if the force applied for bonding is not uniform at the corners of the driver IC chip in four directions, the driver integrated circuit is likely not to operate normally.

That is to say, in the case where the power pads and the ground pads are placed only at the position of the input pad section, if the force applied to the input pad section for bonding is greater than the force applied to the output pad section for bonding, the bonding force of the output pad section becomes insufficient, which can lead to poor image. Conversely, if the force applied to the output pad section is greater than the force applied to the input pad section, the bonding force of the power pads and the ground pads becomes insufficient, which can cause various problems such as image noise and defective frequency reception.

As a result, in the source driver IC chip and the gate driver IC chip according to the conventional art, due to the fact that the power pads and the ground pads are placed at one side of the chip, when the force applied to the chip for bonding is not uniform, problems such as poor image and defective frequency reception can be caused.

SUMMARY OF THE INVENTION

Accordingly, the present invention has been made in an effort to solve the problems occurring in the related art, and an object of the present invention is to provide a pad layout structure of a driver IC chip in which power pads of a driver IC chip are located at the corners of the driver IC chip in four directions so that the problems caused when mounting the driver IC chip to a liquid crystal display panel can be minimized.

In order to achieve the above object, according to one aspect of the present invention, there is provided a pad layout structure of a driver IC chip to be mounted to a liquid crystal display panel, comprising power pad sections placed at respective four corners of the driver IC chip and each having a first power pad for supplying first power to the driver IC chip, a second power pad for supplying second power to the driver IC chip, a third power pad for supplying third power to the driver IC chip and a fourth power pad for supplying fourth power to the driver IC chip.

BRIEF DESCRIPTION OF THE DRAWINGS

The above objects, and other features and advantages of the present invention will become more apparent after a reading of the following detailed description taken in conjunction with the drawings, in which.

DETAILED DESCRIPTION OF PREFERRED EMBODIMENT

Figure 1:
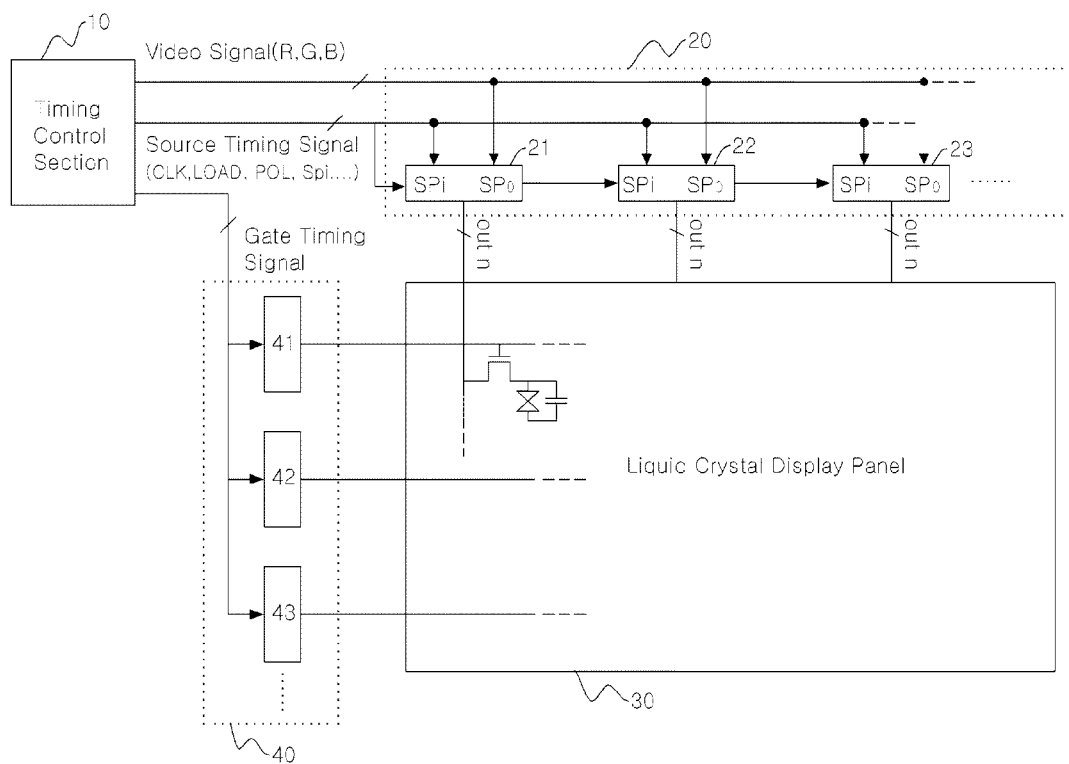
FIG. 1 is a view schematically illustrating the structure of a conventional liquid crystal display.
Figure 2:
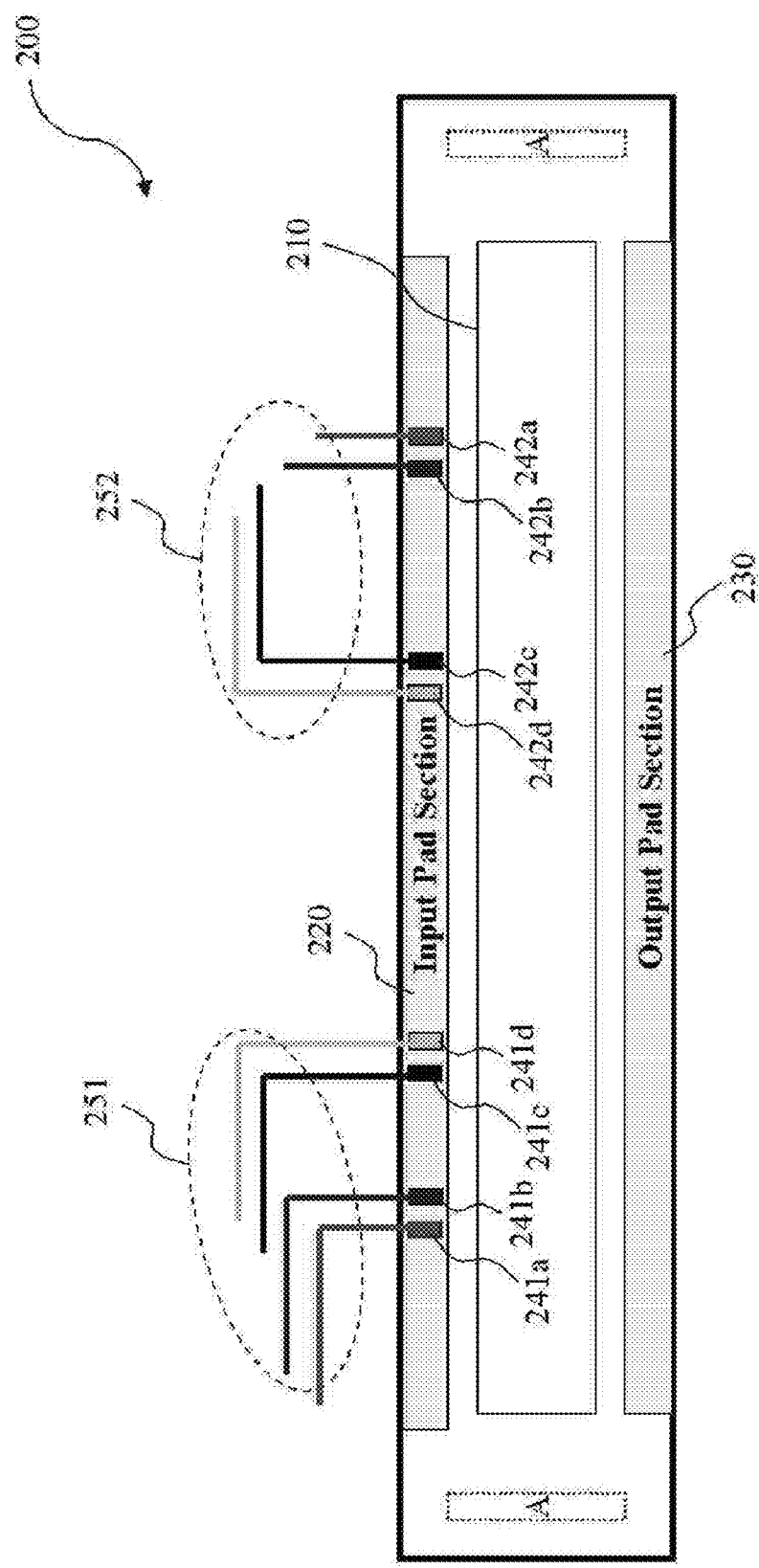
FIG. 2 is a view illustrating a pad layout structure of a driver IC chip which is mounted in a COG type according to the conventional art.

A key idea of the present invention is to provide a pad layout structure of a driver IC chip in which power pads of a driver IC chip are located at the corners of the driver IC chip in four directions so that the problems caused when mounting the driver IC chip to a liquid crystal display panel can be minimized.

Reference will now be made in greater detail to a preferred embodiment of the invention, an example of which is illustrated in the accompanying drawings. Wherever possible, the same reference numerals will be used throughout the drawings and the description to refer to the same or like parts.

Figure 3:
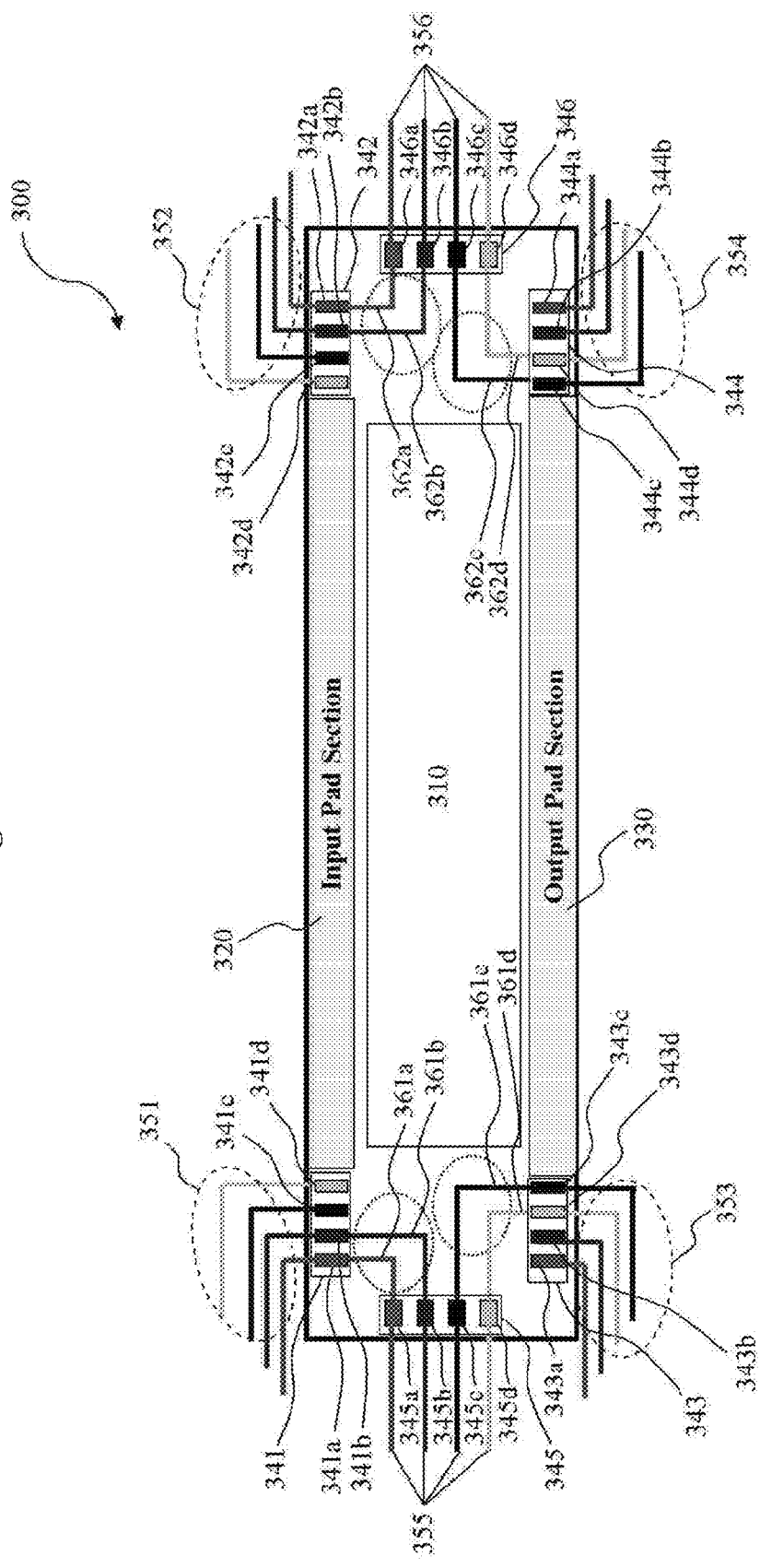
FIG. 3 is a view illustrating a pad layout structure of a driver IC chip in accordance with an embodiment of the present invention.

FIG. 3 is a view illustrating a pad layout structure of a driver IC chip in accordance with an embodiment of the present invention.

Referring to FIG. 3, in the driver IC chip 300 according to the present invention, an internal circuit 310 is placed centrally, an input pad section 320 is placed adjacent to the upper side edge of the chip 300, and an output pad section 330 is placed adjacent to the lower side edge of the chip 300.

Unlike the conventional driver IC chip in which the power pads are placed adjacent to the input pad section or at the left or right end portion of the chip, in the driver IC chip 300 according to the present invention, power pad sections are formed at the four corners and the left and right end portions of the driver IC chip 300.

For the sake of convenience in explanation, power pad sections 341 through 344 which are placed at the four corners of the driver IC chip 300 are designated as corner power pad sections, and power pad sections 345 and 346 which are placed at the left and right end portions of the driver IC chip 300 are designated as side power pad sections.

Power supply lines 351 through 356 for supplying power are connected to the power pad sections 341 through 346. The power supply lines 351 through 356 are bonded to a glass substrate in a line-on-glass (LOG) type.

The corner power pad sections 341 through 344 and the side power pad sections 345 and 346 respectively have first power pads 341a through 346a for supplying first power (VDD1) to the driver IC chip 300, second power pads 341b through 346b for supplying second power (VSS1), third power pads 341c through 346c for supplying third power (VDD2), and fourth power pads 341d through 346d for supplying fourth power (VSS2).

The first power (VDD1) can be used as supply power for digital signal processing, and the second power (VSS1) can be used as ground power for digital signal processing. The third power (VDD2) can be used as supply power for analog signal processing, and the fourth power (VSS2) can be used as ground power for analog signal processing.

The corner power pad section 341, which is placed at the left upper portion of the driver IC chip 300, is connected with the left side power pad section 345 between the side power pad sections 345 and 346 placed at the left and right end portions of the driver IC chip 300, which is closer thereto. The first power pad 341a of the corner power pad section 341 and the first power pad 345a of the side power pad section 345 are connected with each other by a first power pad connection line 361a, and the second power pad 341b of the corner power pad section 341 and the second power pad 345b of the side power pad section 345 are connected with each other by a second power pad connection line 361b.

The corner power pad section 343, which is placed at the left lower portion of the driver IC chip 300, is connected with the left side power pad section 345 between the side power pad sections 345 and 346 placed at the left and right end portions of the driver IC chip 300, which is closer thereto. The third power pad 343c of the corner power pad section 343 and the third power pad 345c of the side power pad section 345 are connected with each other by a third power pad connection line 361c, and the fourth power pad 343d of the corner power pad section 343 and the fourth power pad 345d of the side power pad section 345 are connected with each other by a fourth power pad connection line 361d.

The first power pad connection line 361a, the second power pad connection line 361b, the third power pad connection line 361c and the fourth power pad connection line 361d can be bonded to the glass substrate in the LOG type by bypassing the driver IC chip 300 or can be formed in the driver IC chip 300.

The corner power pad section 342, which is placed at the right upper portion of the driver IC chip 300, is connected with the right side power pad section 346 between the side power pad sections 345 and 346 placed at the left and right end portions of the driver IC chip 300, which is closer thereto. The first power pad 342a of the corner power pad section 342 and the first power pad 346a of the side power pad section 346 are connected with each other by a first power pad connection line 362a, and the second power pad 342b of the corner power pad section 342 and the second power pad 346b of the side power pad section 346 are connected with each other by a second power pad connection line 362b.

The corner power pad section 344, which is placed at the right lower portion of the driver IC chip 300, is connected with the right side power pad section 346 between the side power pad sections 345 and 346 placed at the left and right end portions of the driver IC chip 300, which is closer thereto. The third power pad 344c of the corner power pad section 344 and the third power pad 346c of the side power pad section 346 are connected with each other by a third power pad connection line 362c, and the fourth power pad 344d of the corner power pad section 344 and the fourth power pad 346d of the side power pad section 346 are connected with each other by a fourth power pad connection line 362d.

The first power pad connection line 362a, the second power pad connection line 362b, the third power pad connection line 362c and the fourth power pad connection line 362d can be bonded to the glass substrate in the LOG type by bypassing the driver IC chip 300 or can be formed in the driver IC chip 300.

As a consequence, in the pad layout structure of a driver IC chip according to the present invention, the power pad sections 341 through 346 formed in the driver IC chip 300 are placed at the corners in four directions and the left and right end portions of the drive IC chip 300, and the first power pad connection lines 361a and 362a through the fourth power pad connection lines 361d and 362d for connecting the first power pads 341a through 346a through the fourth power pads 341d through 346d of the power pad sections 341 through 346 are connected by bypassing the driver IC chip 300.

Due to the fact that the power pads placed at the corners in four directions and the left and right end portions of the driver IC chip are connected to a liquid crystal display panel in the LOG type, the problems caused when bonding the driver IC chip and the liquid crystal display panel can be minimized.

As is apparent from the above description, the pad layout structure of a driver IC chip according to the present invention provides advantages in that, since power pads of a driver IC chip are located at the corners of the driver IC chip in four directions, the adhesion between the driver IC chip and a liquid crystal display panel can be enhanced even in the case where force is non-uniformly applied to the driver IC chip when mounting the driver IC chip to the liquid crystal display panel.

Although a preferred embodiment of the present invention has been described for illustrative purposes, those skilled in the art will appreciate that various modifications, additions and substitutions are possible, without departing from the scope and the spirit of the invention as disclosed in the accompanying claims.

What is claimed is:

1. A driver IC chip mounted to a liquid crystal display panel included in a liquid crystal display, wherein the liquid crystal display also comprises a power supply and a timing controller, the driver IC chip comprising:
    first, second, third, and fourth power pad sections placed at respective four corners of upper and lower side edges of the driver IC chip, wherein each of the first, second, third, and fourth power pad sections comprises a first power pad configured to supply first power to the driver IC chip from the power supply, a second power pad configured to supply second power to the driver IC chip from the power supply, a third power pad configured to supply third power to the driver IC chip from the power supply, and a fourth power pad configured to supply fourth power to the driver IC chip from the power supply, wherein each of the first, second, third, and fourth power pads is connected to the power supply via one or more power supply lines;
    an input pad section comprising one or more input pads, wherein the one or more input pads are connected to the timing controller via one or more signal lines, wherein the one or more input pads are configured to receive one or more control signals from the timing controller via the one or more signal lines, and wherein the input pad section is placed on the upper side edge of the driver IC chip between the first power pad section and the second power pad section; and
    an output pad section comprising one or more output pads, wherein the one or more output pads are connected to the liquid crystal display panel via one or more connection lines, wherein the one or more output pads are configured to output one or more signals to the liquid crystal display panel via the one or more connection lines, and wherein the output pad section is placed on the lower side edge of the driver IC chip between the third power pad section and the fourth power pad section,
    wherein an additional power pad section is placed in at least one of left or right end portions of the driver IC chip, and wherein the upper and lower side edges are longer than the left and right end portions,
    wherein the first corner of the driver IC chip is positioned at the left end portion of the upper side edge, wherein the second corner of the driver IC chip is positioned at the right end portion of the upper side edge, wherein the third corner of the driver IC chip is positioned at the left end portion of the lower side edge, and wherein the fourth corner of the driver IC chip is positioned at the right end portion of the lower side edge.

2. The driver IC chip according to claim 1, wherein each of the first, second, third, and fourth power pad sections placed at the four corners of the driver IC chip is connected with either the left side power pad section or the right side power pad section.

3. The driver IC chip according to claim 2, wherein the first power pad and the second power pad of the second power pad section and the first power pad and the second power pad of the right side power pad section are connected with each other via a first power pad connection line and a second power pad connection line.

4. The driver IC chip according to claim 3, wherein the third power pad and the fourth power pad of the fourth power pad section and the third power pad and the fourth power pad of the right side power pad section are connected with each other via a third power pad connection line and a fourth power pad connection line.

5. The driver IC chip according to claim 4, wherein the first power pad connection line, the second power pad connection line, the third power pad connection line, and the fourth power pad connection line are connected by bypassing the driver IC chip.

6. The driver IC chip according to claim 5, wherein the first power pad connection line, the second power pad connection line, the third power pad connection line, and the fourth power pad connection line are connected in a line-on-glass (LOG) type.

7. The driver IC chip according to claim 1, wherein the first power is supply power for digital signal processing, and the second power is ground power for digital signal processing.

8. The driver IC chip according to claim 1, wherein the third power is supply power for analog signal processing, and the fourth power is ground power for analog signal processing.

9. The driver IC chip according to claim 1, wherein the driver IC chip is mounted to the liquid crystal display panel in a chip-on-glass (COG) type.

10. The driver IC chip according to claim 4, wherein the first power is supply power for digital signal processing, and the second power is ground power for digital signal processing.

11. The driver IC chip according to claim 10, wherein the third power is supply power for analog signal processing, and the fourth power is ground power for analog signal processing.

12. The driver IC chip according to claim 4, wherein the driver IC chip is mounted to the liquid crystal display panel in a chip-on-glass (COG) type.

13. The driver IC chip according to claim 5, wherein the first power is supply power for digital signal processing, and the second power is ground power for digital signal processing.

14. The driver IC chip according to claim 13, wherein the third power is supply power for analog signal processing, and the fourth power is ground power for analog signal processing.

15. The driver IC chip according to claim 5, wherein the driver IC chip is mounted to the liquid crystal display panel in a chip-on-glass (COG) type.

16. The driver IC chip according to claim 6, wherein the first power is supply power for digital signal processing, and the second power is ground power for digital signal processing.

17. The driver IC chip according to claim 16, wherein the third power is supply power for analog signal processing, and the fourth power is ground power for analog signal processing.

18. The driver IC chip according to claim 6, wherein the driver IC chip is mounted to the liquid crystal display panel in a chip-on-glass (COG) type.

19. The driver IC chip according to claim 1, further comprising:
- a left side power pad section placed at the left end portion of the driver IC chip between the first power pad section and the third power pad section, wherein the left side power pad section comprises first, second, third, and fourth power pads each configured to supply power to the driver IC chip from the power supply; and
- a right side power pad section placed at the right end portion of the driver IC chip between the second power pad section and the fourth power pad section, wherein the right side power pad section comprises first, second, third, and fourth power pads each configured to supply power to the driver IC chip from the power supply.

* * * * *